(12) United States Patent
Mascolo et al.

(10) Patent No.: US 7,834,344 B2
(45) Date of Patent: Nov. 16, 2010

(54) NANOMETRIC STRUCTURE AND CORRESPONDING MANUFACTURING METHOD

(75) Inventors: Danilo Mascolo, Ercolano (IT);
Gianfranco Cerofolini, Milan (IT);
Gianguido Rizzotto, Civate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1100 days.

(21) Appl. No.: 11/215,296

(22) Filed: Aug. 30, 2005

(65) Prior Publication Data
US 2006/0051919 A1   Mar. 9, 2006

(30) Foreign Application Priority Data
Aug. 31, 2004   (EP) .................................. 04425649

(51) Int. Cl.
*H01L 25/10* (2006.01)
*H01L 45/00* (2006.01)

(52) U.S. Cl. .................. 257/28; 977/712; 977/781; 257/E25.023; 257/E25.031; 257/E45.001

(58) Field of Classification Search ............... 977/701, 977/708, 709, 710, 711, 712, 720, 721, 723, 977/779, 784, 785, 932, 936, 702, 703, 704, 977/705, 706, 722, 783, 933, 934, 935, 937, 977/938, 939, 940, 941, 942, 943, 944, 945, 977/946, 947, 948, 949, 950, 951, 952, 953, 977/954, 955, 956, 957, 958, 959, 960, 961, 977/962, 963; 257/9, 14, 28, 618, 619, 622, 257/623, 798, E25.022, E25.023, E25.031, 257/E27.004, E29.111, E29.112, E45.001
See application file for complete search history.

(56) References Cited

U.S. PATENT DOCUMENTS

| 5,262,336 | A | 11/1993 | Pike, Jr. et al. |
| 5,272,114 | A | 12/1993 | van Berkum et al. |
| 5,500,869 | A | 3/1996 | Yoshida et al. |
| 5,520,244 | A | 5/1996 | Mundinger et al. |
| 6,365,059 | B1 | 4/2002 | Pechenik .................... 216/52 |
| 6,664,173 | B2 * | 12/2003 | Doyle et al. ................ 438/587 |
| 6,897,101 | B2 | 5/2005 | Weitz |

(Continued)

FOREIGN PATENT DOCUMENTS

DE   101 23 364 A1   11/2002

(Continued)

*Primary Examiner*—Lynne A Gurley
*Assistant Examiner*—Andrew O Arena
(74) *Attorney, Agent, or Firm*—Lisa K. Jorgenson; Robert Iannucci; Seed IP Law Group PLLC

(57) ABSTRACT

A hosting structure of nanometric components is described advantageously comprising: a substrate; n array levels on said substrate, with n≧2, arranged consecutively on growing and parallel planes, each including a plurality of conductive spacers alternated with a plurality of insulating spacers and substantially perpendicular to said substrate, with definition between consecutive conductive spacers of at least a gap, conductive spacers of consecutive array levels lying on distinct and parallel planes, said gaps of different array levels being at least partially aligned along a direction substantially perpendicular to said substrate with definition of a plurality of transversal hosting seats extended along said direction and suitable for hosting at least a nanometric component. A nanometric electronic device is also described comprising such a hosting structure and a method for realizing it.

38 Claims, 15 Drawing Sheets

U.S. PATENT DOCUMENTS

| | | |
|---|---|---|
| 6,936,891 B2 | 8/2005 | Saito et al. |
| 7,138,331 B2 * | 11/2006 | Park et al. .................... 438/622 |
| 7,142,772 B2 | 11/2006 | Blauvelt et al. |
| 7,366,009 B2 | 4/2008 | Katti |
| 7,413,973 B2 * | 8/2008 | Park et al. .................... 438/597 |
| 7,432,120 B2 * | 10/2008 | Mascolo et al. ............... 438/42 |
| 7,456,508 B2 * | 11/2008 | Mascolo et al. ............. 257/331 |
| 2002/0043690 A1 | 4/2002 | Doyle et al. ................. 257/368 |
| 2003/0059983 A1 | 3/2003 | Ota et al. .................... 438/128 |
| 2003/0104700 A1 | 6/2003 | Fleming et al. |
| 2004/0057276 A1 * | 3/2004 | Nejad et al. ................. 365/158 |
| 2004/0146863 A1 | 7/2004 | Pisharody et al. .............. 435/6 |
| 2005/0249473 A1 | 11/2005 | Page et al. |
| 2006/0051919 A1 | 3/2006 | Mascolo et al. |
| 2006/0113587 A1 | 6/2006 | Thies et al. |
| 2007/0051994 A1 | 3/2007 | Song et al. |

FOREIGN PATENT DOCUMENTS

| | | |
|---|---|---|
| DE | 102 47 679 A1 | 4/2004 |
| EP | 0 313 493 A2 | 4/1989 |
| EP | 1 278 234 A2 | 1/2003 |
| WO | WO 99/04440 | 1/1999 |
| WO | WO 02/35580 A2 | 5/2002 |
| WO | WO 02/37571 A1 | 5/2002 |
| WO | WO 03/005369 A2 | 1/2003 |

* cited by examiner

NANOMETRIC STRUCTURE AND CORRESPONDING MANUFACTURING METHOD

BACKGROUND OF THE INVENTION

1. Field of the Invention

The present invention relates, in its more general aspect, to the field of the electronics with nanometric components and to the field of the nano-manufacturing.

In particular, the invention relates to a nanometric architecture or structure with parallel arrays having a multi-spacer structure comprising a plurality of elements or spacers, being substantially bar-like, arranged according to an ordered, lined up configuration.

The invention also relates to a method of making a structure of the above considered type.

2. Description of the Related Art

As it is well known, in the field of the microelectronics the need of realizing circuit configurations of more and more reduced dimensions is particularly felt.

In the last thirty years, the progress of the electronic technology has followed a trend governed by that which is known as "Moore Law", an empirical law stating that the capacity of storing information in memory devices doubles each eighteen months approximately, whereas the calculation performance of the CPUs (Central Processing Units) improve of a factor each twenty-four months, as reported in the diagram of FIG. 1.

The Moore law is based on the capacity of reducing the geometries of the considered devices and it highlights how dimensions have passed from being equal to 2 μm for the nineteen eighties technologies, to being equal to 130 nm in 2001, to currently being equal to 90 nm.

However, the current technology is quickly reaching the physical limits of its possibilities; in particular, the currently used photolithography processes are subject to drastic dimensional limitations for values being lower than 100 nm.

Forward techniques have thus been developed such as x-ray non optic lithography, extreme ultra-violet lithography and the electronic beam lithography which allow to realize circuit configurations with dimensions in the order of some tens of nanometres.

These techniques, however, require complex instruments characterized by excessively long times of lithographic etching and they thus result too expensive for being applied to a mass industrial manufacturing.

As an alternative, controlled deposition and selective removal techniques of a functional material on a suitable substrate have been developed.

These techniques have allowed for the adjustment of methods for realizing semiconductor substrates suitable for obtaining different typologies of transistors, as for example indicated in the U.S. Pat. Nos. 6,570,220 and 6,063,688 both to Doyle et al.

In particular, in these patents a transistor with field effect is described comprising a sub-micrometric conductive region and, respectively, a relative method for realizing it.

The transistor described in such patent has a channel region comprising a plurality of conductive elements, or spacers, which are lined up and have a length substantially equivalent to that of the channel region, and also comprising a dielectric material to fill in the space between consecutive spacers.

The plurality of lined up conductive elements is realized by means of a method which essentially comprises the steps of realizing, on a silicon substrate by means of lithography, first spacers of a first material whereon, by means of controlled deposition, a layer of a second material is then realized.

The layer of second material is deposited with a thickness approximately corresponding to half of the width of the first spacers.

A selective removal step of the second material follows, carried out by means of anisotropic etching, through which second spacers are formed, each being adjacent to respective side portions of the first spacers, and each having width equal to the thickness of the layer of the second material.

With a subsequent selective chemical etching the first spacers are removed, leaving on the surface of the semiconductor substrate the second spacers. A further step comprising the deposition of a layer of a third material, controlled in the thickness, followed by a selective removal with anisotropic etching, defines third spacers.

These third spacers, each adjacent to respective side portions of the second spacers, have equal width to the thickness of the layer of the third material. By means of a selective chemical etching the second spacers are removed leaving on the surface of the semiconductor substrate solely the third spacers.

The steps of controlled deposition, of anisotropic chemical etching and of selective etching are repeated more times, for realizing spacers of reduced width of 100 Å or less, separated from one another by a distance of about 200 Å.

By finally depositing some dielectric material in the region defined between two consecutive spacers, a conductive region is realized which can be used for realizing a CMOS transistor.

The above method needs, however, a preliminary and accurate programming since each realisation step of an order n (with $n \geq 2$) of spacers is followed by a removal step of the spacers of the previous order (n−1), and it is thus initially necessary to provide a suitable distance and a suitable thickness of the first spacers for realizing in the end last spacers of desired dimensions.

In the U.S. Pat. No. 6,664,173 to Doyle et al., a technique is also described for patterning a hardmask gate, for all the typologies of transistors, by using a gate spacer for approaching nanometric masks. This technique provides starting from a unit comprising a substrate whereon first gate and respectively hardmask layers and subsequent second gate and respectively hardmask layers are deposited.

On the second hardmask layer, by means of deposition and further etching steps, a nanometric spacer is defined used as mask for realizing a gate electrode for a first transistor.

From the first hardmask layer of the same unit a structure is realized for a second transistor further to other deposition and etching steps.

Subsequent steps are however required for realizing a MOS device.

Although satisfying the aim, this method is limited in that it allows to realize, although of nanometric dimensions, a single gate electrode for a transistor.

In substance, all the known methods clash with the need of realizing nanometric structures and provided with suitable conduction and control terminals for using them as semiconductor electronic devices.

BRIEF SUMMARY OF THE INVENTION

One embodiment of the present invention provides a method for realizing a hosting structure of nanometric elements overcoming the dimensional limits of the semiconductor electronic devices realized according to the methods provided by the prior art.

Another embodiment of the present invention provides a structure suitable for realizing conduction terminals for at least one nanometric component realized by means of a molecular component, i.e., by means of a functionalised molecule capable of performing specific actions. The structure comprises:

a substrate;

n array levels on said substrate, with n≧2, arranged consecutively on growing and parallel planes, each array level including a plurality of conductive spacers alternating with a plurality of insulating spacers and substantially perpendicular to said substrate, each conductive spacer and an adjoining insulating spacer forming a spacer pair, with definition between consecutive spacer pairs a gap, wherein, conductive spacers of any two consecutive array levels lying on distinct and parallel planes, said gaps of different array levels being at least partially aligned along a direction substantially perpendicular to said substrate with definition of a plurality of transversal hosting seats extended along said direction and suitable for hosting at least a nanometric component.

In particular, a nanometric semiconductor structure is provided which is able to host the above molecular components, and able to realize conduction terminals for these molecular components.

Another embodiment of the invention provides a method for realizing a nanometric structure comprising:

a deposition step, on an upper surface of a substrate, of a block-seed having a side wall substantially perpendicular to said upper surface;

a first repetition of m steps, with m≧3, each step comprising:

a deposition on said substrate of a layer of a predetermined material, and an anisotropic etching of said layer, with realisation, at each repetition, of at least one relative spacer substantially perpendicular to said upper surface, said predetermined material being different for each pair of consecutive depositions, said m steps defining at least a first multilayer body comprising m spacers realized with at least two different materials alternated to each other, respectively a first insulating material and a conductive material, a dimensioning step with removal of a portion of said at least one multilayer body and realisation of at least one re-dimensioned multilayer body having a lower height than said block-seed;

a second repetition of n steps, with n≧3, each of said steps comprising a deposition of a layer and an anisotropic etching of the deposited layer, by depositing at least three different materials in each tern of consecutive deposition realizing, above said at least a first re-dimensioned multilayer body, at least a second multilayer body comprising n spacers realized with at least three different materials respectively with a conductive material and with at least two different insulating materials;

a selective etching step of multilayer body for removing in said multilayer bodies defined portions of said spacers of insulating material with definition of a plurality of nanometric, transversal hosting seats, extended along a direction substantially perpendicular to said substrate.

In substance according to the invention a structure is provided able to host the above molecular components realizing a semiconductor electronic device of the hybrid type.

A nanometric electronic device as defined by the characterising part of the herewith annexed claim 11 is also claimed.

Further characteristics and advantages of the hosting structure according to the invention will be apparent from the following description of an embodiment thereof given by way of indicative and non limiting example with reference to the annexed drawings.

DETAILED DESCRIPTION OF THE INVENTION

One embodiment of the present invention starts from the idea of providing an electronic device comprising a plurality of molecular components as nanometric elements as well as a single hosting structure able to host such plurality of molecular components and to realize the conduction and control terminals.

Figure 1:
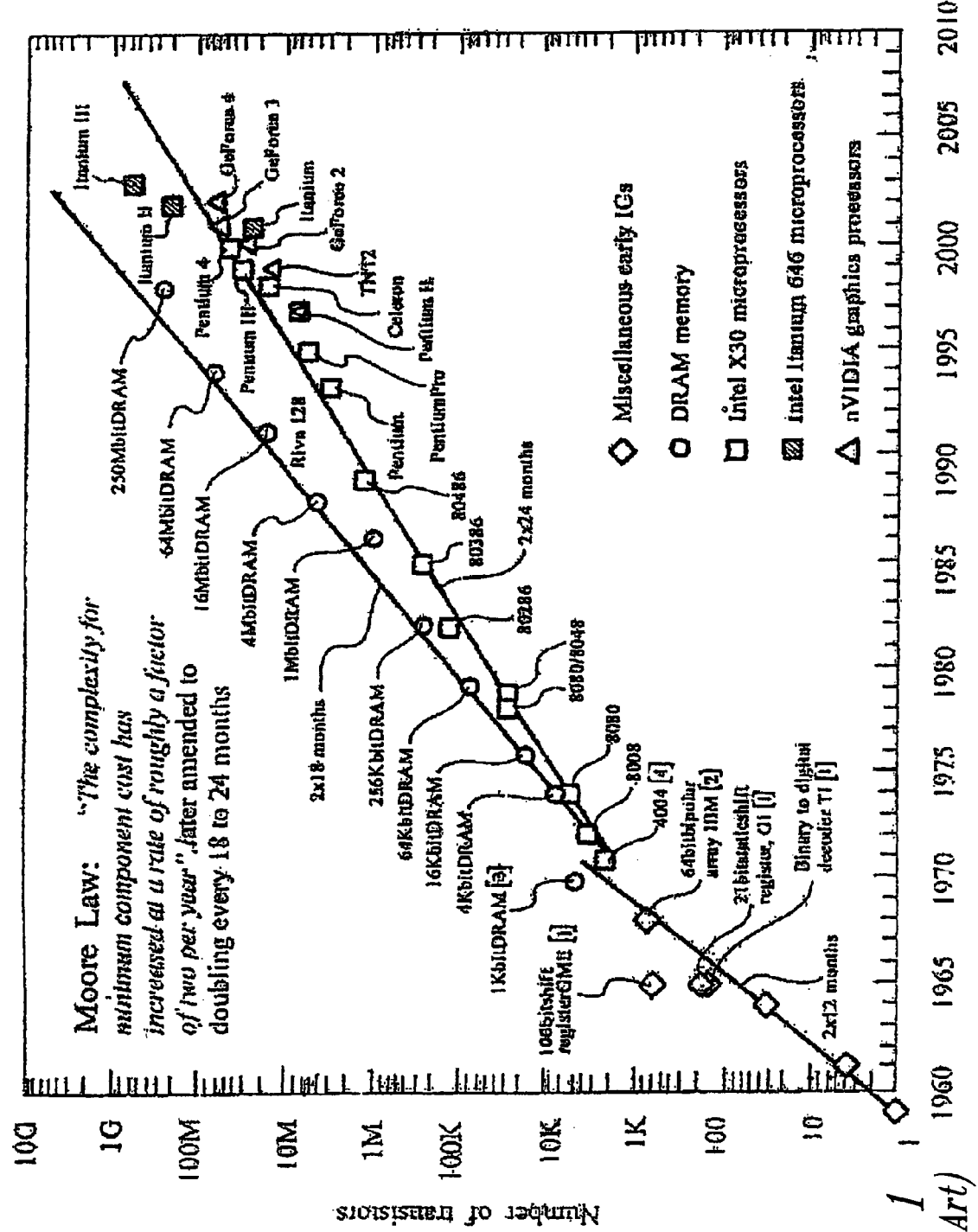
FIG. 1 is a diagram reporting the Moore Law.
Figure 2:
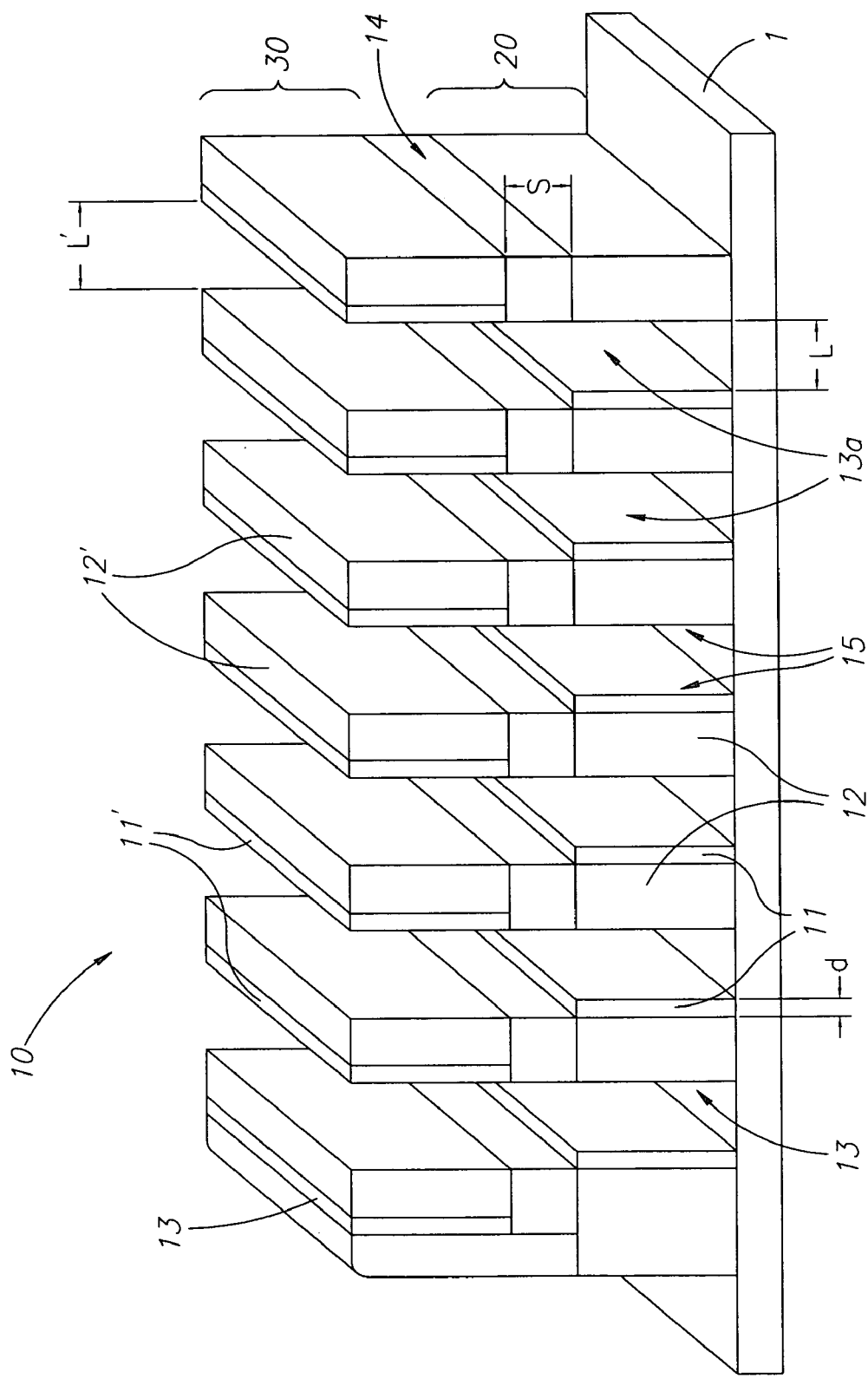
FIG. 2 shows a schematic, perspective, enlarged view of a nanometric structure according to the present invention.

With reference to FIG. 2, such a hosting structure is shown, globally indicated with 10, for hosting a plurality of molecular components, not shown in the figures, according to the present invention.

It is to be noted that the figures representing schematic views of portions of an integrated circuit during the manufacturing are not drawn to scale, but they are instead drawn so as to stress the important characteristics of the invention.

The hosting structure 10, realized above an insulating substrate 1, for example a silicon oxide substrate, comprises a first array level 20 and a second array level 30, level 30 being arranged above level 20.

Each array level 20, 30, comprises a plurality of conductive spacers 11 and 11', essentially bar-like shaped, parallel to each other and having a first thickness indicated with d.

These conductive spacers 11 and 11', arranged according to a predetermined spatial relation, are perpendicular to the substrate 1 with definition, in each array level 20, 30, of a plurality of gaps 13, 13', respectively.

Each array level 20, 30 also comprises a plurality of insulating spacers 12, 12', respectively, each alternating with the above conductive spacers 11, 11', respectively. These insulating spacers 12, 12' are bar-like and perpendicular to the substrate 1.

Conveniently, in each array level 20 (30), each insulating spacer 12 (12') of said plurality of insulating spacers is alternated with and adjacent to a respective conductive spacer 11 (11') of said plurality of conductive spacers. More particularly, each conductive spacer 11 (11') is adjoining one insulating spacer 12 (12') to form a spacer pair. Each spacer pair is thus separated from one another by a gap.

In particular, in the example of FIG. 2, in correspondence with the array 20, the gaps 13 are defined between a conductive spacer 11 and a consecutive insulating spacer 12, and, in correspondence with the array 30, the gaps 13' are defined between an insulating spacer 12' and a consecutive conductive spacer 11.

According to one embodiment of the invention, conductive spacers 11 and 11' of consecutive array levels 20, 30, lie on different planes, and in particular they lie on planes being parallel to each other and perpendicular to the substrate 1.

According to another characteristic of the invention, the above pluralities of gaps 13 of different array levels 20, 30, are arranged, in the hosting structure 10, aligned with each other, so as to define a plurality of elongated slots, here identified as transversal hosting seats 13a, extended along a direction substantially perpendicular to the substrate 1.

In other words, in the hosting structure 10 each hosting seat 13a is common to both array levels 20, 30 of the hosting structure itself.

These gaps have a width, indicated with "L", in correspondence with 13 of the first array level 20, and a width indicated with "L'" in correspondence with 13' of the second array level 30. In a preferred embodiment of the invention, the widths L and L' are equal to each other to define hosting seats 13a having a nanometric width adjusted on the dimensions of the molecular component to be hosted, preferably below 50 nm and most preferably below 10 nm.

Moreover, the hosting structure 10 comprises, interposed between the above first 20 and second 30 array level, a discontinuous insulating layer 14 of a predetermined thickness "s", advantageously a silicon oxide layer. This discontinuous insulating layer 14, in practice, separates pairs of adjoining insulating 12 and conductive 11 spacers belonging to two different array levels 20, 30, from overlapping with each other.

In this way, the hosting structure 10 comprises a plurality of hosting seats 13a, each hosting seat 13a being defined by side walls 15 and by a portion of the substrate 1 as bottom.

In particular, the side walls 15 comprise the conductive spacers 11 and 11', as conductive portions, arranged in such a way that in a same hosting seat 13a conductive spacers of overlapped array levels 20, 30, define conductive portions on opposite side walls 15.

Preferably, the first array level 20 comprises insulating spacers 12 realized with a first insulating material, for example silicon oxide, whereas the second array level comprises insulating spacers 12' realized with a second insulating material, for example silicon nitride.

Conveniently, the hosting structure 10 comprises conductive spacers 11 and 11' realized with polysilicon, with constant nanometric thickness "d" adjusted to the dimensions of the molecular component to be hosted, preferably below 50 nm and most preferably below 10 nm.

As from what has been described, the hosting structure 10 according to the invention comprises a plurality of nanometric hosting seats 13a, having walls comprising the insulating spacers 12 and 12' as insulating portions and the conductive spacers 11 and 11' as conductive portions. In these hosting seats 13a it is thus possible to host a plurality of functionalized nanometric molecules, or molecular components, which can be driven by conduction terminals advantageously made of the above conductive spacers 11 for orienting the functionalized molecules which realize them.

In the example shown in the figure, the conductive spacers 11 and 11' are arranged on two arrays of overlapped levels 20, 30, realizing pairs of conduction terminals inside the hosting seats 13a and allow in particular to orient bi-functionalized molecules.

For hosting three-functionalized molecules, the present invention provides a hosting structure 100, which will be described with reference to the FIG. 3, wherein the parts being structurally and functionally equal to those of the hosting structure 10 preserve the same reference numbers.

The hosting structure 100 comprises, interposed between the first 20 and the second 30 array level, an intermediate array level 40.

According to the invention, this intermediate array level 40 comprises a plurality of conductive spacers 41 each of them being alternated with and adjacent to an insulating spacer 42. Two consecutive pairs of adjoining conductive 41 and insulating 42 spacers defines a respective gap 43.

In the hosting structure 100, the gaps 43 of the intermediate array level 40 are aligned with the gaps 13 and 13', defined in the first 20 and in the second 30 array level, so as to define a plurality of elongated slots or transversal hosting seats 130a, extended along a direction substantially perpendicular to the substrate 1.

In practice, in the hosting structure 100 hosting seats are defined 130a common to three array levels, and therefore common to the first array level 20, to the second array level 30 realized above the first level 20, and to the intermediate array level 40 between this first 20 and second 30 array levels.

Still more it can be noted that the hosting structure 100 comprises a plurality of hosting seats 130a defined by a portion of substrate 1 as bottom and by side walls 150 perpendicular to the substrate 1 and comprising conductive spacers 11, 11' and 41 as conductive portions and insulating spacers 12, 12' and 42 as insulating portions. In particular, conductive spacers of consecutive array levels lie on different planes and define, for a same hosting seat 130a, conductive portions 11, 11' and 41 on opposite side walls 150.

In this way, in each hosting seat 130a of the hosting structure 100 three conductive spacers 11, 11' and 41, are exposed, being alternated, i.e. faced, considering consecutive array levels, on opposite side walls 150 delimiting the hosting seat.

Conveniently, the insulating spacers 42 of the intermediate array level 40, are realized with the same first insulating material with which the insulating spacers 12 of the first array level 20 are realized; and still conveniently they have an equal thickness to the thickness of the above insulating spacers 12 of the first array level 20.

Similarly to what has been seen in relation to the embodiment of FIG. 2, the hosting structure 100 may further comprise, between each pair of overlapped array levels, a discontinuous intermediate layer 14, advantageously a silicon oxide layer.

From what has been described it follows that, in the hosting structure 100 according to the invention, it is possible to host, in the hosting seats 130a, three-functionalized molecules realizing molecular components such as transistors.

It is also possible to orient these three-functionalized molecules by means of the three conductive spacers 11, 11' and 41 of the hosting structure 100 which, advantageously, serve as conduction terminals for the molecular components realized by these three-functionalized molecules.

For hosting particularly complex molecules or molecular components, it is possible to provide in the hosting structure according to the invention, further intermediate array levels 40 arranged on growing planes, between the first and the second array level 20, 30, and to realize a plurality of parallel array levels overlying one on top of another.

It is also possible to provide, between each consecutive pairs of these further intermediate array levels 40, discontinuous insulating intermediate layers 14.

It is still possible to provide, in the hosting structure according to the invention, conductive spacers of a same array level having variable thickness; or it is possible to provide a constant thickness in each of the array level and being different from different array levels.

Also the hosting seats 13a, 130a can be provided with variable widths, for example, with widths scaling down from a predetermined value.

A main advantage of the hosting structures 10, 100, according to the present invention stays in the nanometric dimensions it has. In particular it stays in the nanometric dimensions conferred to the hosting seats and to the conductive spacers of the different array levels.

The conductive spacers define conductive portions of the walls which delimit these hosting seats, and therefore they allow to retain and drive inside the hosting seats nanometric transistors by suitably orienting the properly functionalized molecules which realize them.

Another advantage of the here considered hosting structure, is represented by the arrangement of the conductive spacers which are faced and alternated, considering consecutive array levels and a single hosting seat, on opposite side walls of this hosting seat. A similar arrangement allows to minimize, in the molecules hosted in the hosting structure, tensions due to the steric space of the functional groups.

Still another advantage is in the possibility of orienting the functionalized molecules having a different number of fictionalizations, by varying the number of array levels.

Another advantage stays in the possibility of orienting functionalized molecules having variable dimensions, by varying the width of the hosting seats; as well as of varying the properties of the conduction terminals of the molecular components realized by these functionalized molecules, by varying the thickness of the conductive spacers, i.e., of the conduction terminals themselves.

A further advantage stays in the capacity of hosting and orienting, in each of the hosting seats, more than one functionalized molecule or molecular component, "flanked" one to the other, allowing to realize semiconductor electronic devices having a high integration or component density.

It is thus possible to realize a nanometric electronic device by providing a nanometric hosting structure as previously described and to host therein a plurality of nanometric components, in particular molecular components having respective conduction terminals realized by the conductive spacers of the hosting structure.

With reference to the FIGS. 4 to 14, an embodiment of a manufacturing method of a nanometric structure according to the present invention is now described.

The steps hereafter described are not a complete flow of a method for realizing such a structure and only those steps=necessary to a skilled technician of the field for the comprehension of the invention are described.

The here considered realization method can be put into practice by using the common techniques employed in the manufacturing of the semiconductor electronic devices.

The method provides a deposition step, on an upper surface 1a of an insulating substrate 1, of a block-seed 50 having a side wall 50a of a height indicated with "h" that is perpendicular to this upper surface 1a of the substrate 1.

The block-seed 50 is thus defined by means of a selective chemical etching so as to ensure a good squaring of the block-seed 50, i.e., the perpendicularity relation between the side wall 50a of the block-seed 50 and the upper surface 1a of the substrate 1.

The block-seed 50 is for example realized with a specific material, such as silicon nitride. It is also possible to realize this block-seed 50 by means of deposition of a plurality of overlapped layers also of different materials.

The method thus comprises a succession of cycles repeated m times (m≧3), each of them including a deposition, on the insulating substrate 1, of a layer 52, 54 of a prefixed thickness of a predetermined material and an anisotropic etching of the deposited layer 52, 54 following each deposition step, with realization of adjoining and alternating spacer 62, 64, each having width equal to the thickness with which the corresponding layer is deposited.

In particular, as shown in the example of the FIGS. 5 to 8 where a double repetition is shown, it can be noted how in the deposition, carried out according to conventional techniques, the deposited layer adapts conformably to the underlying topography, including the block-seed 50, whereas the anisotropic etching following each deposition step removes the deposited layer 52, 54 except for portions thereof being perpendicular to the substrate 1. These portions define the above spacer 62, 64 which result to be perpendicular to the upper surface 1a of the substrate 1 itself.

More specifically, the method showing in FIGS. 4-14 comprises the alternating deposition of layers 52, 54 of two different materials; in particular a conductive material and a first insulating material.

Figure 9:
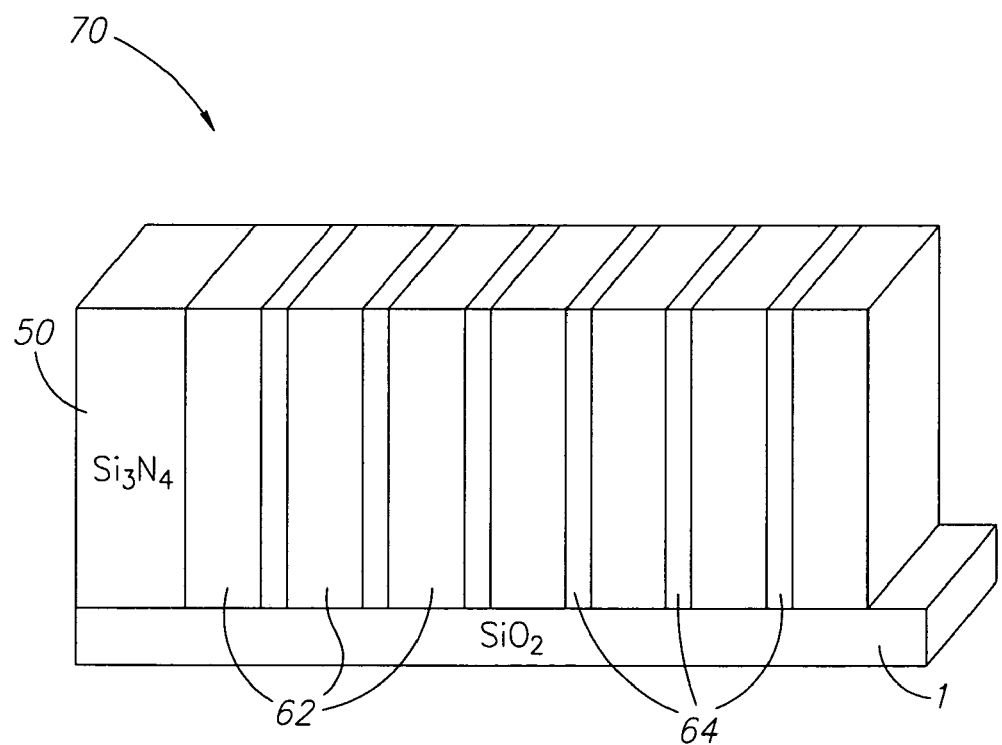

The spacers 62, 64 realized through m repetitions of the steps comprising each the deposition of a layer 52, 54 and the anisotropic etching of the deposited layer, define a first multilayer body globally indicated with 70, which is adjacent, and with an equal height, to the side wall 50a of the block-seed 50, as shown in FIG. 9. The multilayer body 70 comprises m spacers 62, 64 alternately realized with conductive material, for example polysilicon, and with insulating material, for example silicon oxide.

Figure 11:
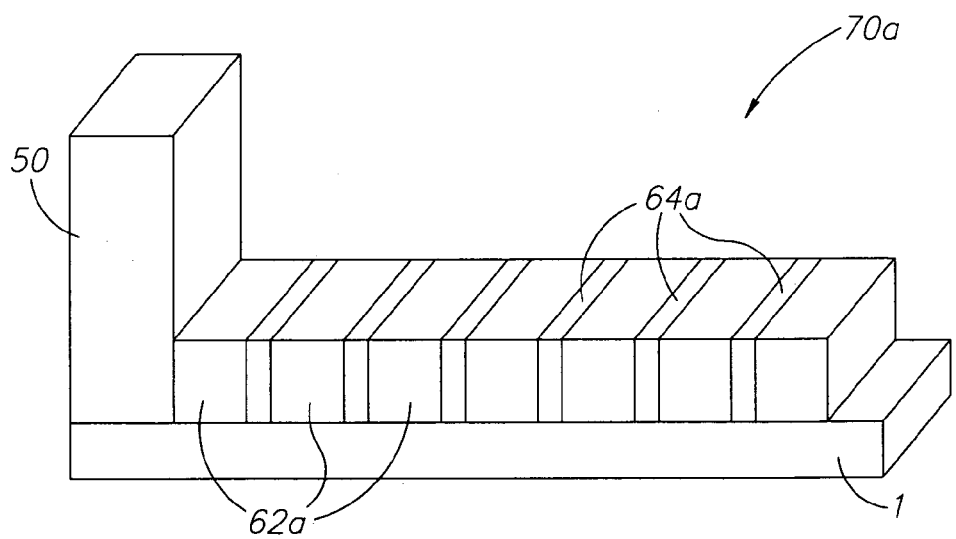
Figure 12:
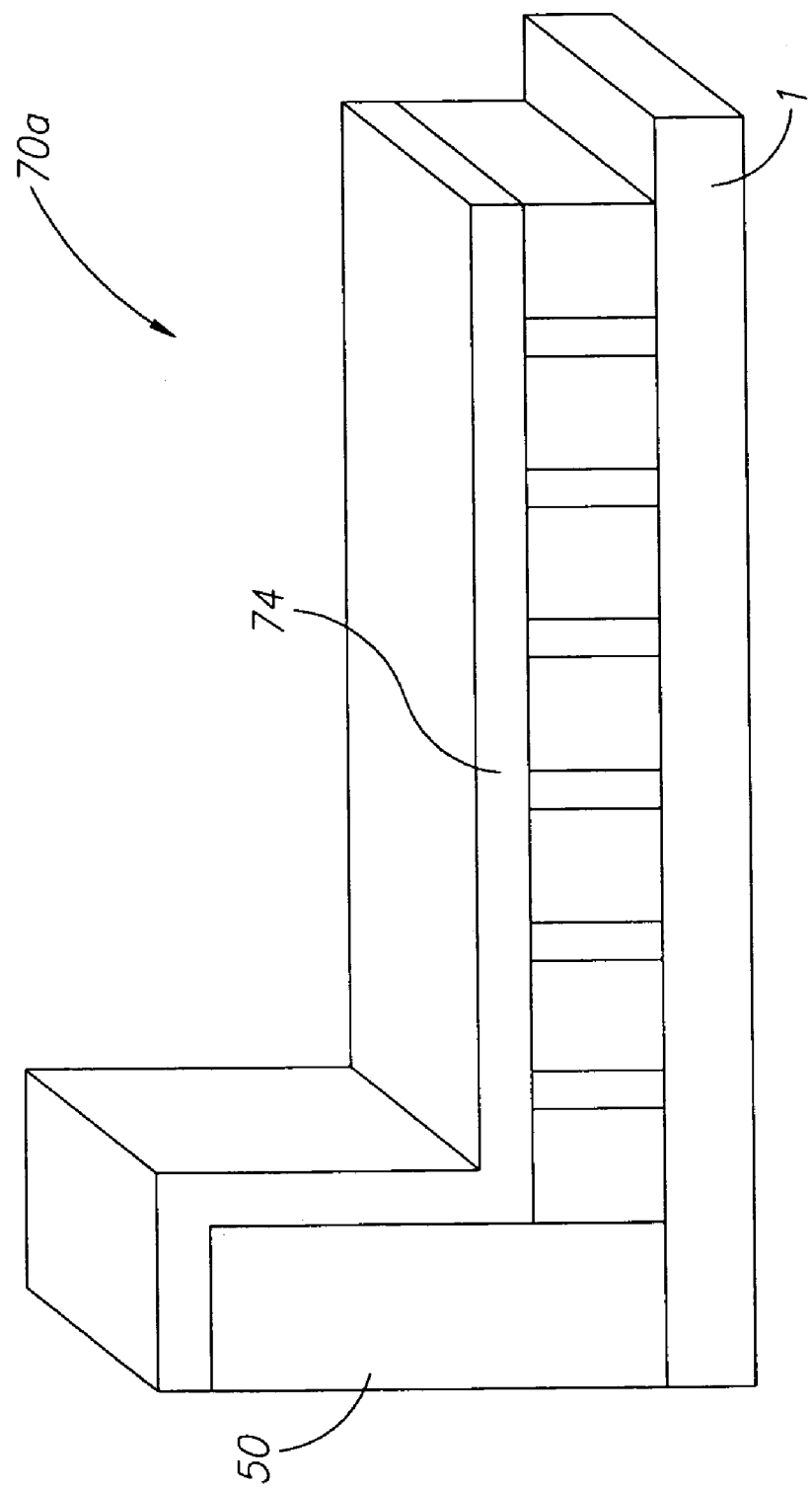

The method thus comprises a dimensioning or reduction step of the first multilayer body 70 with removal of a portion thereof and realization of a re-dimensioned multilayer body 70a, or reduced multilayer body, having a lower height than the height "h" of the side wall 50a of the block-seed 50, as shown in FIG. 11.

Figure 10:
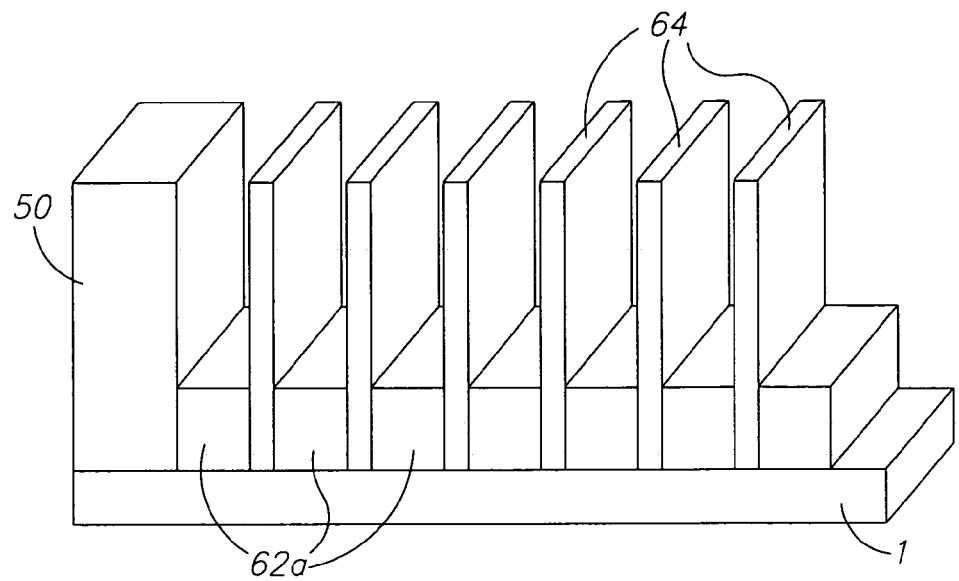

Conveniently, said dimensioning step is carried out according to several strategies, for example by exploiting a partial chemical etching comprising at least a first step of first selective etching towards the first insulating material forming the spacers 62, as shown in FIG. 10 where re-dimensioned insulating spacers 62a can be noted, having a lower height than the height "h" of the conductive spacers 64 they are alternated with.

The dimensioning step thus comprises a second selective etching step towards the conductive material forming the spacers 64, with realization of re-dimensioned conductive spacers 64a, having height equal to the re-dimensioned insulating spacers 62a to form the re-dimensioned multilayer body 70a, as shown in FIG. 11.

The method thus comprises n repetitions, with n≧3, of the above steps, each comprising the deposition of a layer of a predetermined material and the subsequent anisotropic etching step of the deposited layer, and wherein in each tern of consecutive depositions three layers are deposited of three different materials by using again as block-seed the block 50.

Figure 13:
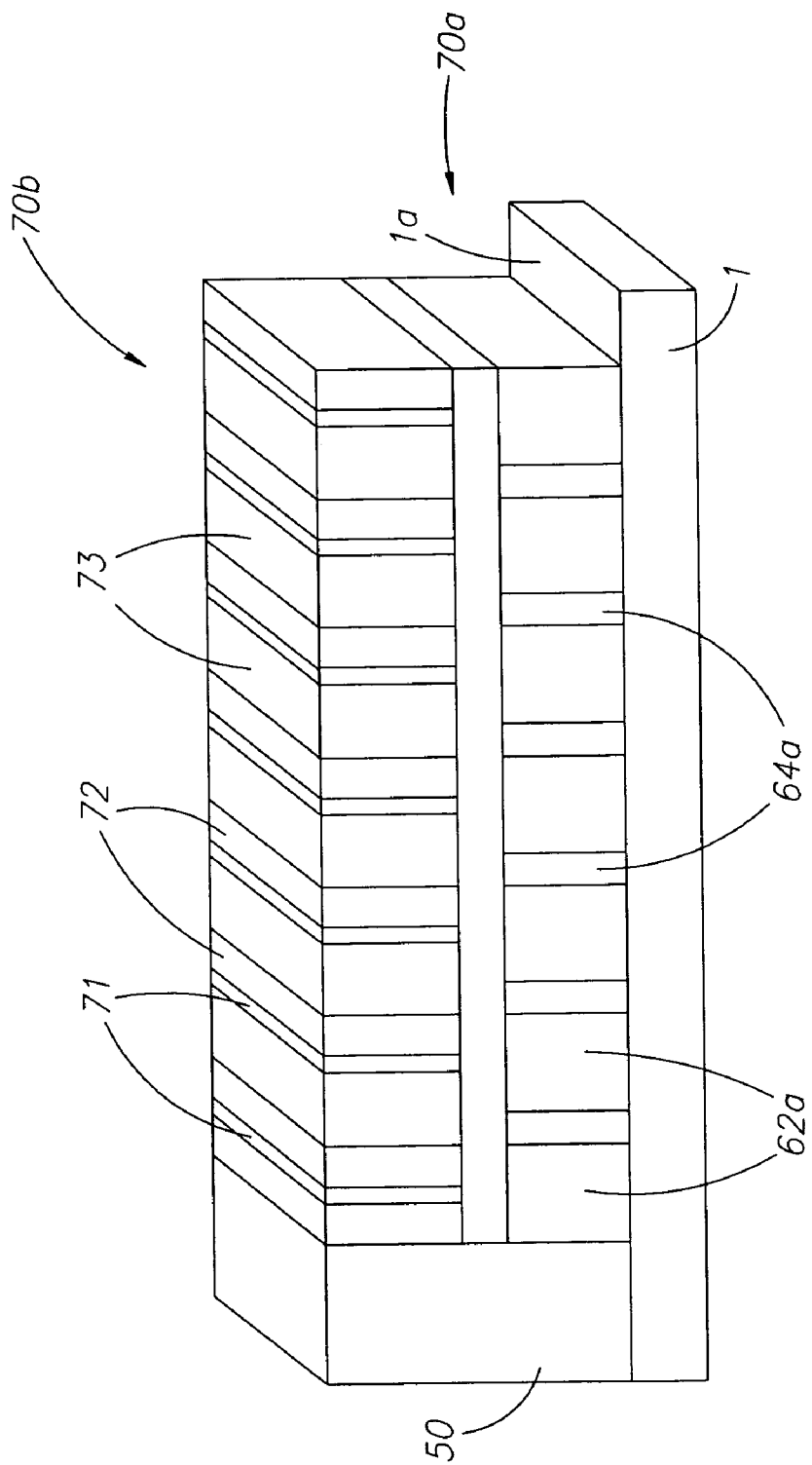

In this way, above the first re-dimensioned multilayer body 70a, a second multilayer body 70b is realized comprising n spacers 71, 72, 73, perpendicular to the upper surface 1a of the substrate 1, respectively realized with conductive material and with two different insulating materials, as highlighted in FIG. 13.

Preferably these two different insulating materials are made of the above first insulating material, in the example silicon oxide, and of a second insulating material, for example silicon nitride.

In each of the above steps the depositions of each layer are controlled in the thickness so as to realize, after each subsequent anisotropic etching, conductive spacers 64a and 71 in the first 70a and in the second multilayer body 70b, to lie on different planes.

The method thus comprises a selective etching step, generally a plasma etching, through which defined portions of spacers 62a and 73 of insulating material are removed, both in the first re-dimensioned multilayer body 70a and in the second multilayer body 70b.

In particular, a selective etching step is provided towards the first insulating material, with removal of the spacers 62a, 73 realized with this first insulating material. This removal is total with respect to spacer 73 in the second multilayer body 70b (which thus does not have residual insulating material of the first type) and partial with respect to spacer 62a in the first re-dimensioned multilayer body 70a. Accordingly, residual portions of re-spacers 62a, masked by the spacers of second insulating material 72 and of conductive material 71 of the second multilayer body 70b, are not removed. In substance, at the end of this etching step, a hosting structure is realized as shown in FIG. 14, similar to the hosting structure 10 previously described with reference to FIG. 2, and having a first array level 70a comprising insulating spacers 62a realized with the first insulating material, alternating with and adjacent to conductive spacers 11, as well as a second array 70b, overlapped to the first array 70a and comprising insulating spacers 72, alternating with and adjacent to conductive spacers 71.

The hosting structure 10 realized with the above described method has, inside the second array 70b, insulating spacers realized with the second insulating material and indicated with 72, corresponding to the insulating spacers 12 as previously described with reference to FIG. 2.

Figure 14:
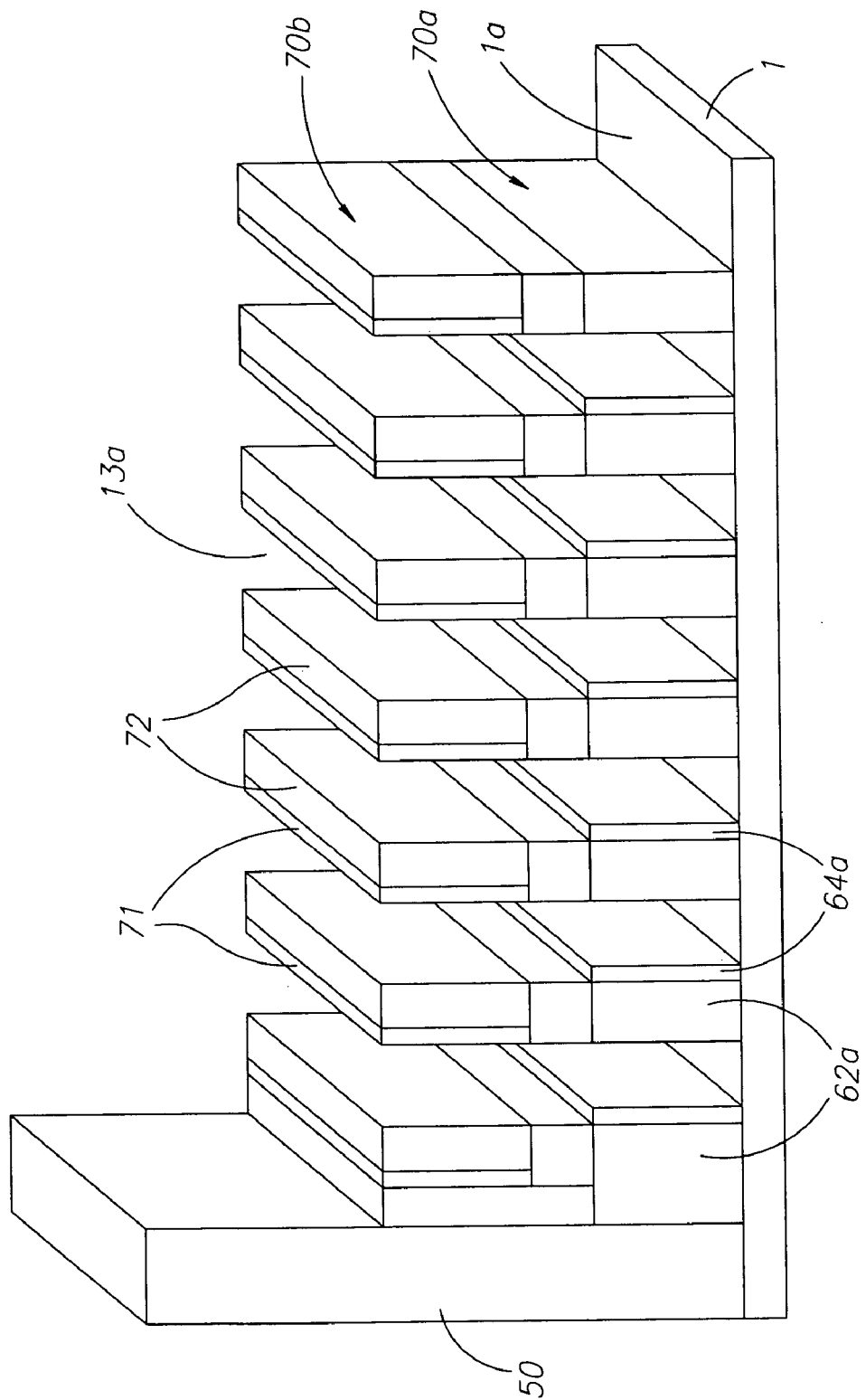

Advantageously, the last selective etching step towards the first insulating material allows to define a plurality of transversal slots extended along a direction perpendicular to the substrate 1, with realization of a plurality of hosting seats 13a for the nanometric hosting structure 10, shown in FIG. 14.

The method further provides a removal step of the block-seed 50, not shown in the figures, carried out by means of a conventional selective etching, for example through steam isotropic technique (Isotropic Wet Etching).

Preferably, the method according to the invention also comprises a deposition step of an intermediate insulating layer 74, above a multilayer body and prior to the formation of a multilayer body overlapped thereto. In particular, in FIG. 12 this intermediate insulating layer 74 is shown being deposited above the first re-dimensioned multilayer body 70a.

Advantageously, this intermediate insulating layer 74 is realized with the same insulating material used in the deposition steps for realizing the multilayer bodies 70a, 70b, for example, silicon oxide, so that it is partially removed in the selective etching steps towards this first insulating material, with definition, in the hosting structure 10 according to the invention, of a discontinuous insulating layer 74 interposed between the first and the second array level 70a, 70b.

Alternatively, this deposition step of an intermediate insulating layer 74 can comprise the deposition of an intermediate insulating layer of a different material. In this case, the method will comprise a selective etching step towards the material of the intermediate insulating layer 74.

The important thing is that, a last selective etching step is provided, wherein portions are removed both from the first re-dimensioned multilayer body 70a and from the second multilayer body 70b, so as to realize the above transversal slots defining the desired hosting seats 13a.

The dimensions of the spacers and the insulating layers are nanometric, preferably below 50 nm and most preferably below 10 nm; they are adjusted to the dimensions and the type of electric behavior of the molecular components to be hosted.

It is obviously possible to deposit, in the realization of a same array level or of different array levels, layers of a same material having non uniform thickness for realizing conductive or insulating spacers, thereby providing nanometric hosting seats of variable dimensions.

In a further embodiment of the method according to the invention, shown with reference to FIGS. 15 to 18, a hosting structure 100b is realized which is suitable for hosting more complex functionalized molecules, for example three-functionalized.

In particular, according to this embodiment, the method further provides the realization of an intermediate re-dimensioned multilayer body 80a, interposed between the above re-dimensioned multilayer body 70a and the above second multilayer body 70b.

Figure 15:
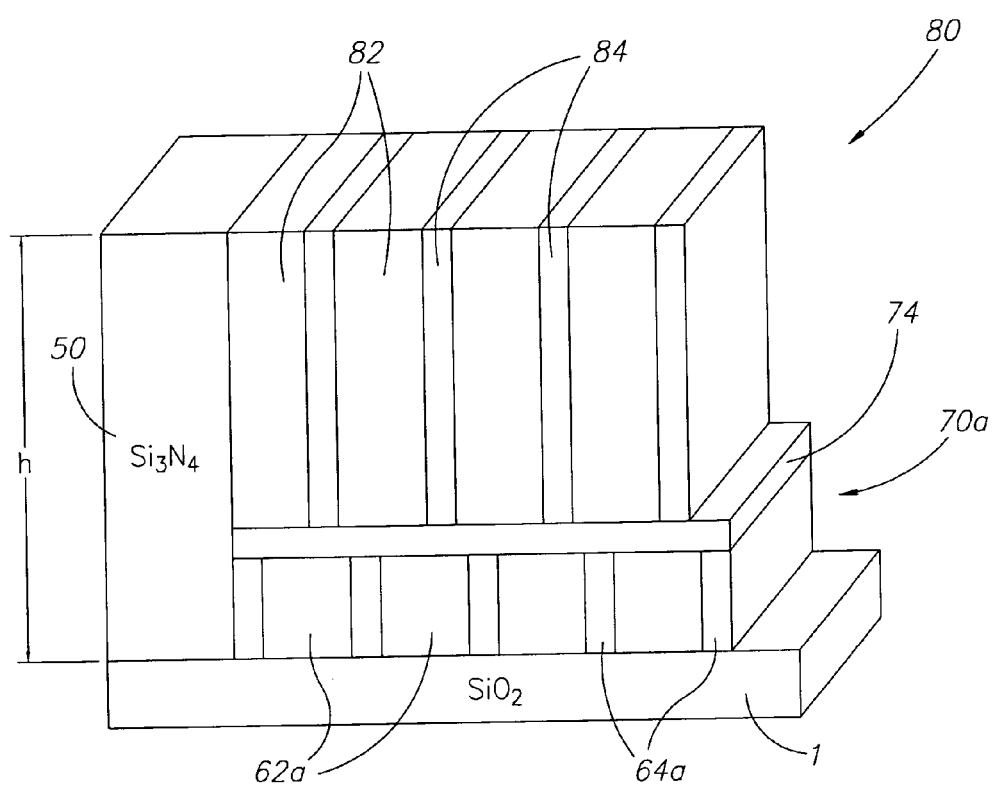
FIGS. 15 to 19 show some steps of the realization method of the nanometric structure according to two alternative embodiments of the invention.

First of all, above the first re-dimensioned multilayer body 70a an intermediate multilayer body 80 is realized by means of the repetition of the above m steps, comprising each the deposition of a layer of predetermined material followed by an anisotropic etching of the deposited layer with realization for each repetition of a pair of adjoining spacer 82, 84. The result of this repetition of cycles is shown in FIG. 15.

Figure 16:
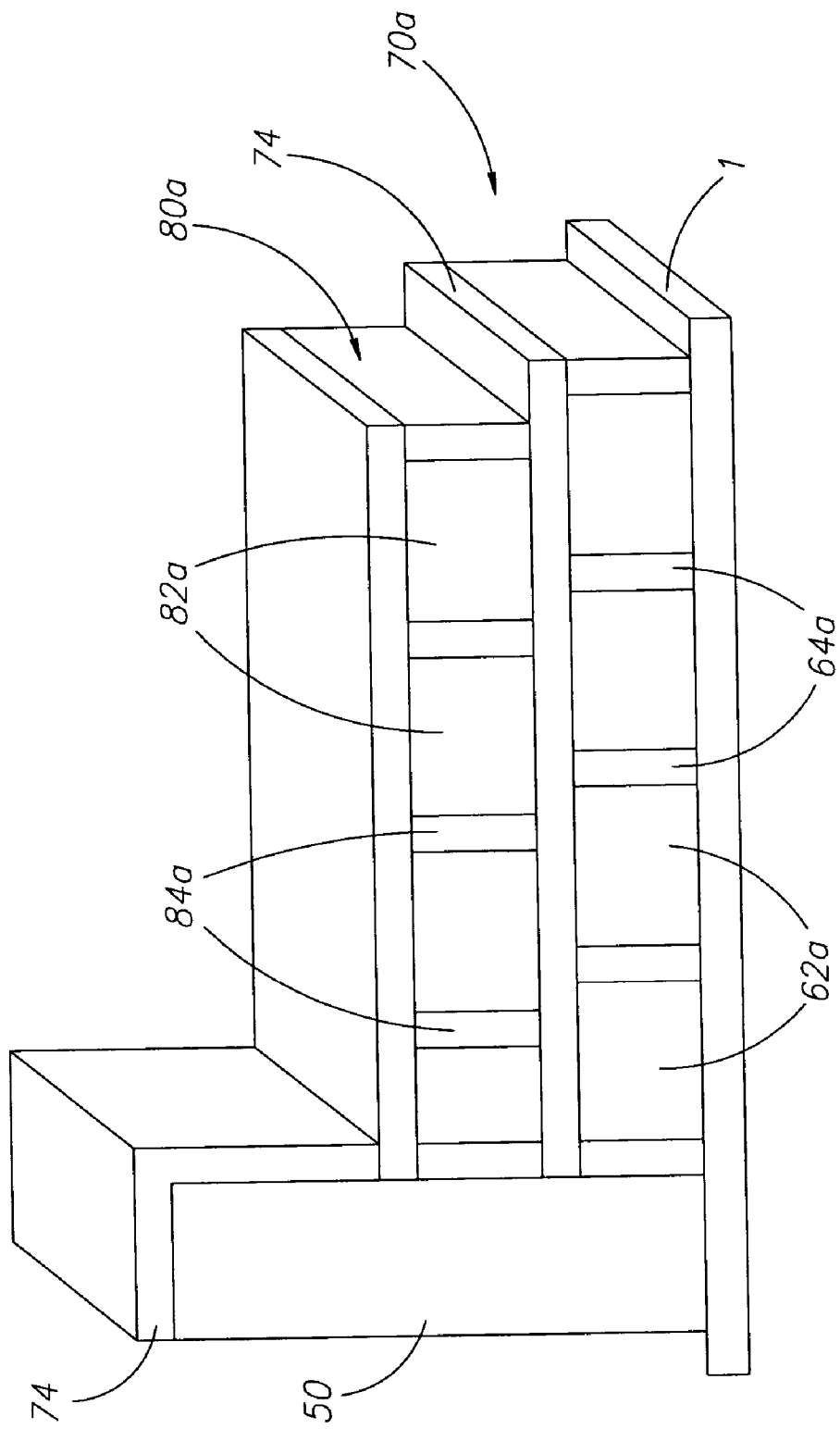

Subsequently, a dimensioning step is provided of the intermediate multilayer body 80 with removal of a portion thereof and realization of the above intermediate re-dimensioned multilayer body 80a having a lower height than the height "h" of the side wall of the block-seed 50, as shown in FIG. 16.

Preferably, the repetition of the above steps provides the alternated deposition of layers of two different materials, conductive and insulating, in an inverted order with respect to what has been done in the depositions carried out for the realization of the first multilayer body 70.

Conveniently these conductive and insulating layers, are deposited in the same respective materials used in the realization of the first multilayer body 70, for example, polysilicon and silicon oxide, and they are again deposited with such a thickness as to allow the spacers of conductive material of overlapped multilayer bodies to lie on different and parallel planes.

Preferably, the deposition of these layers is carried out after the above deposition step of the intermediate insulating layer 74, whereas the dimensioning step of the intermediate multilayer body 80 is preferably followed by a further deposition step of a further intermediate insulating layer 74'.

Advantageously, the intermediate insulating layers 74, 74' are deposited in the same first insulating material, for example silicon oxide.

Figure 17:
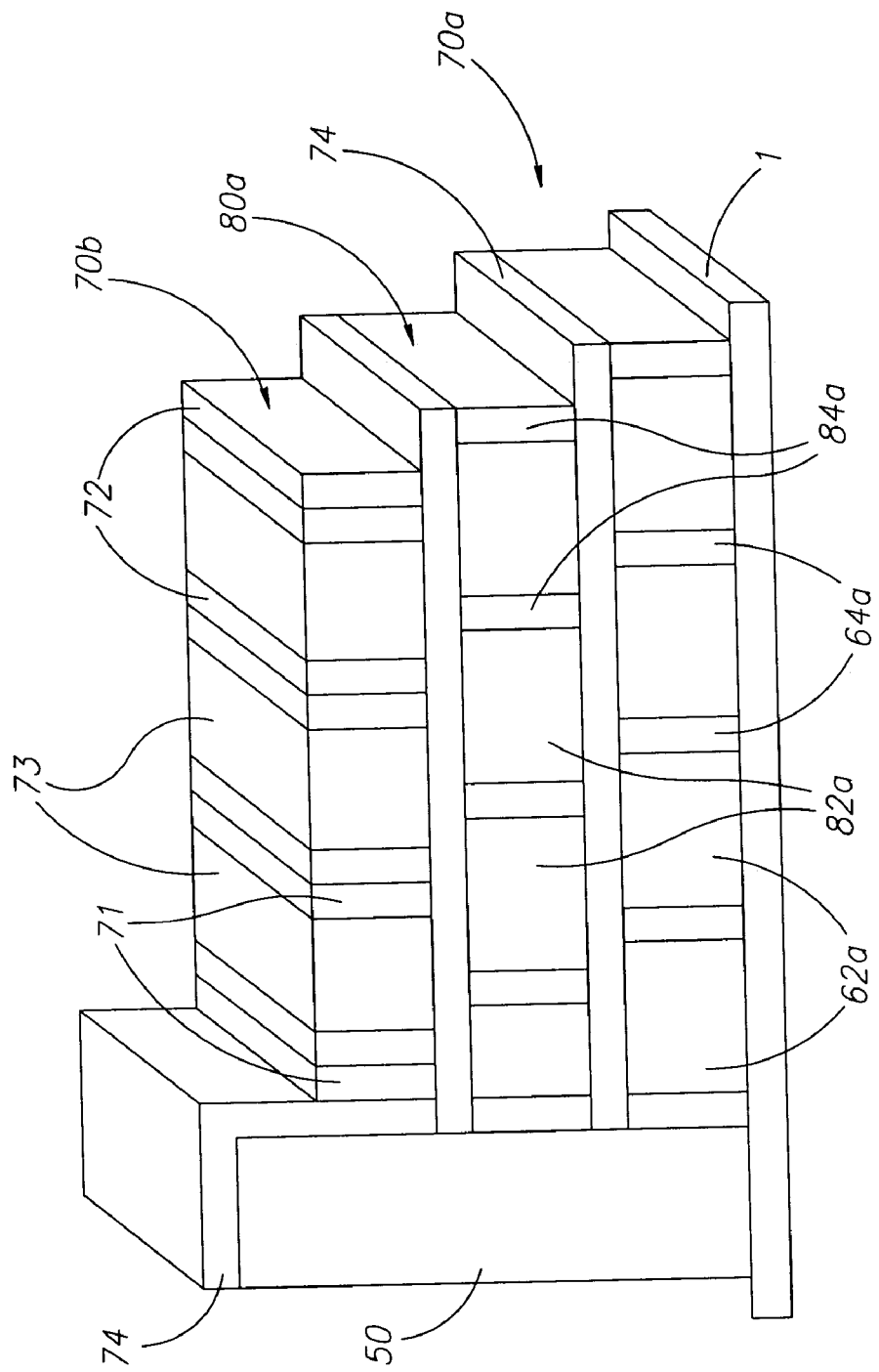

In practice, as highlighted in the example of FIG. 17, three multilayer bodies are realized on three different levels. The first re-dimensioned multilayer body 70a and the intermediate re-dimensioned multilayer body 80a there above, comprise each, being alternated from one another, spacers 64a, 84a realized with conductive material, and spacers 62a, 82a with a first insulating material, the second multilayer body 70b, realized in turn above the intermediate re-dimensioned multilayer body 80a, also comprises spacers 72 realized with a second insulating material, as previously shown.

Figure 18:
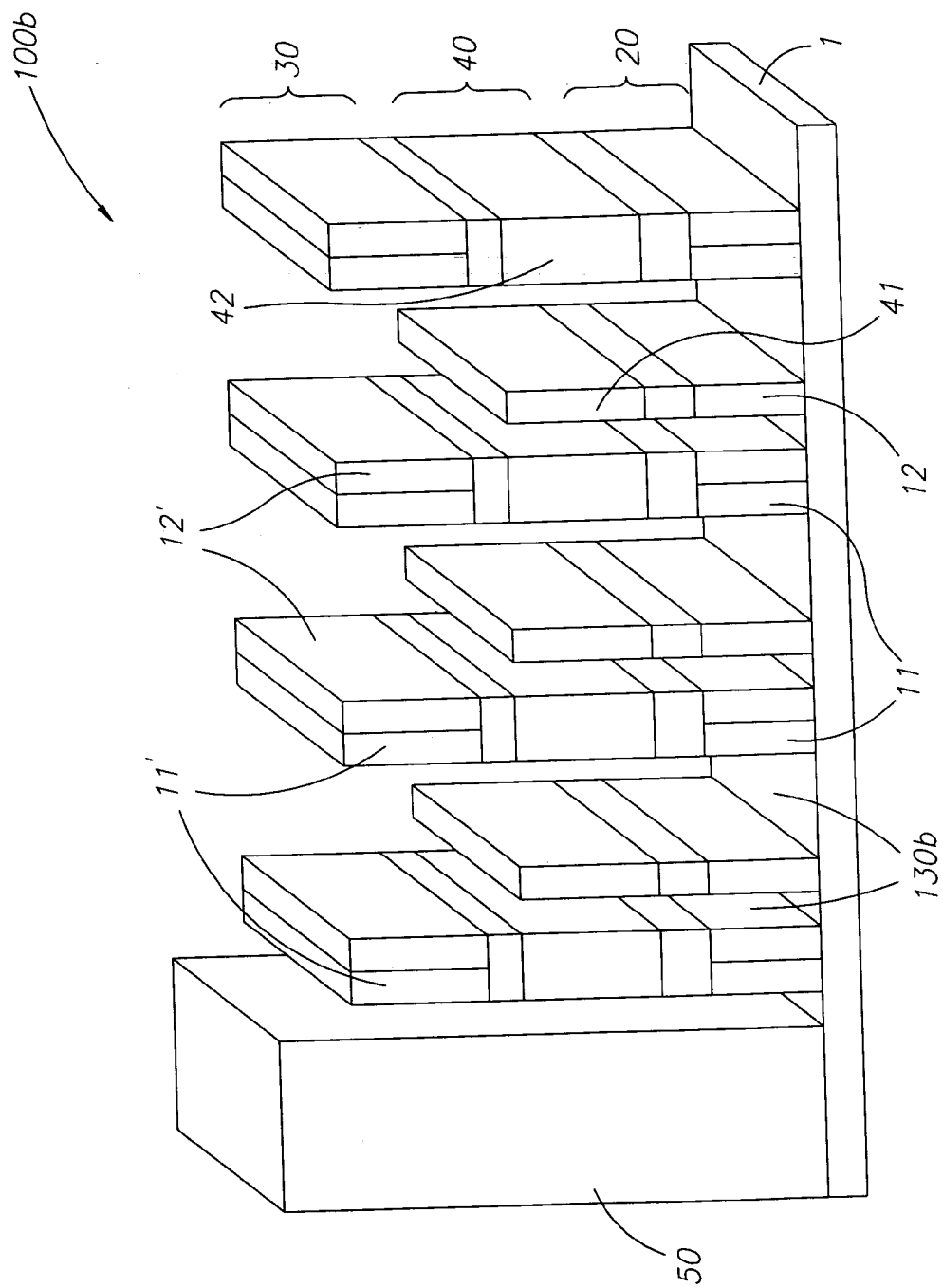

The method according to the invention thus comprises a selective etching step towards the first insulating material, with definition of a plurality of transversal slots extended along a direction perpendicular to the substrate 1, which realize a plurality of nanometric hosting seats 130b, and subsequent realization of the above nanometric hosting structure 100b as shown in the example of FIG. 18.

Figure 3:
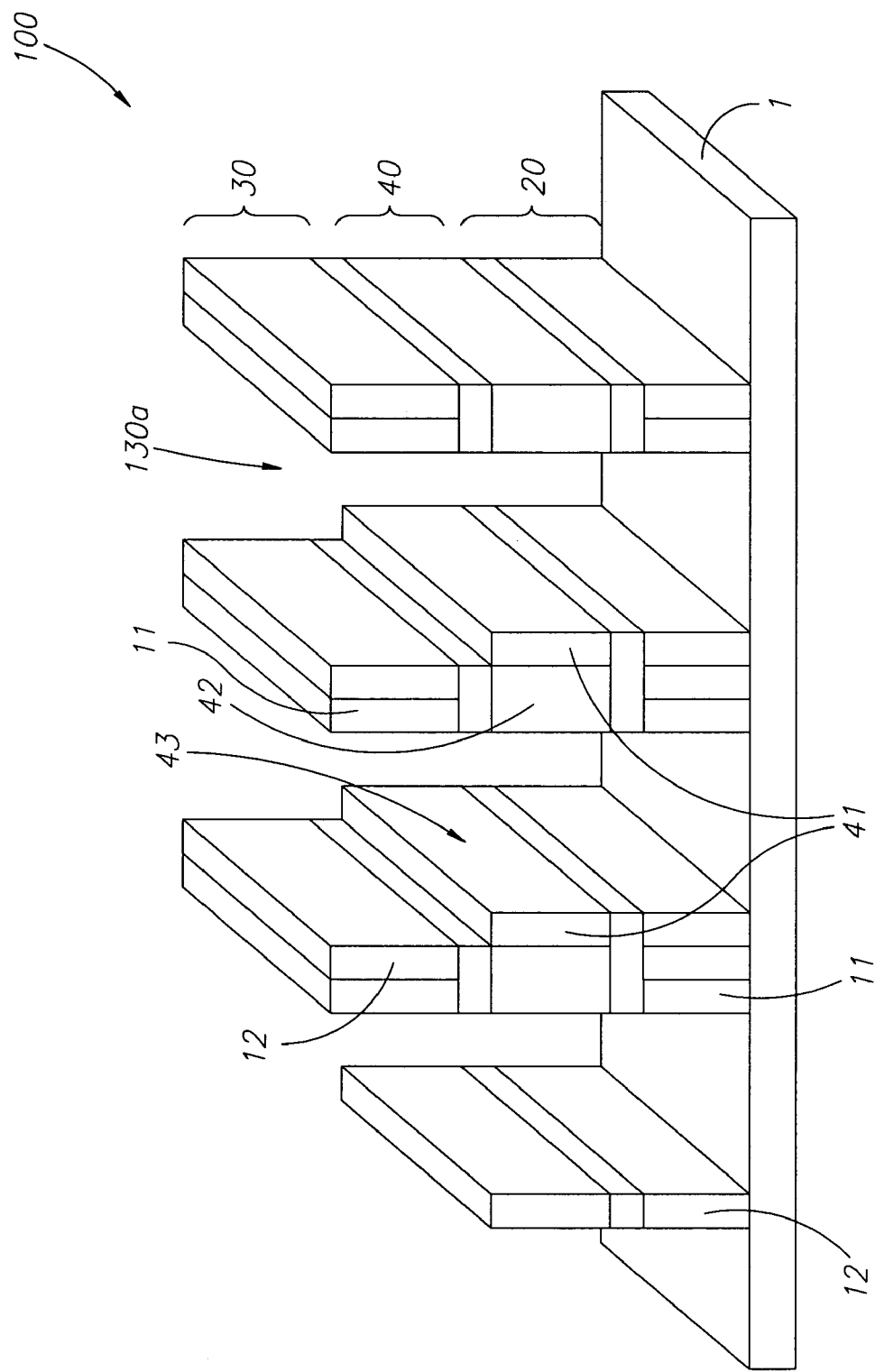
FIG. 3 shows a schematic, perspective, enlarged view of a further embodiment of the structure according to the present invention.
Figure 4:
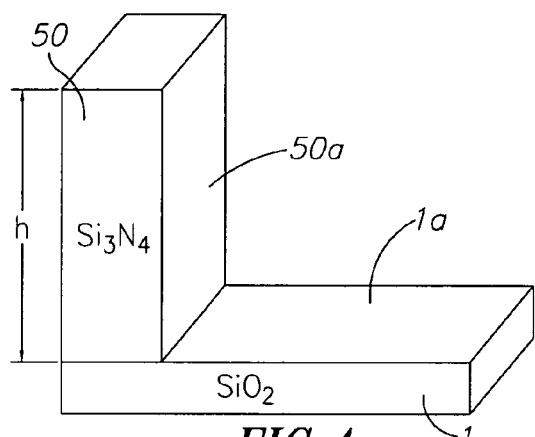
FIGS. 4 to 14 show in sequence the steps of a realization method of the nanometric structure according to the invention.
Figure 5:
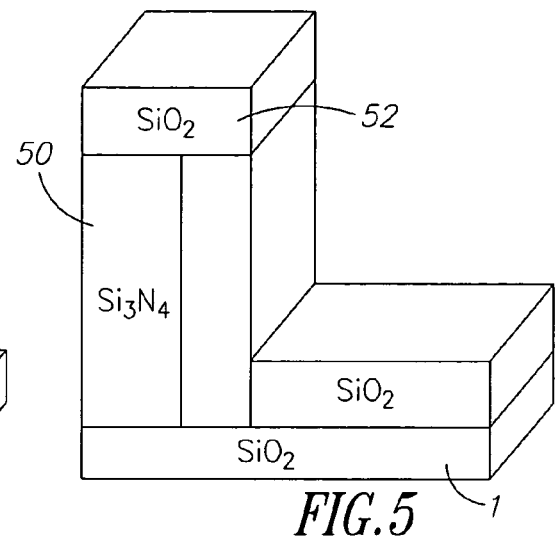
Figure 6:
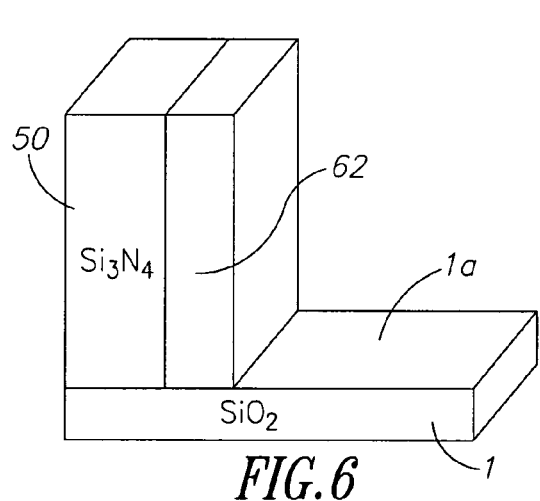
Figure 7:
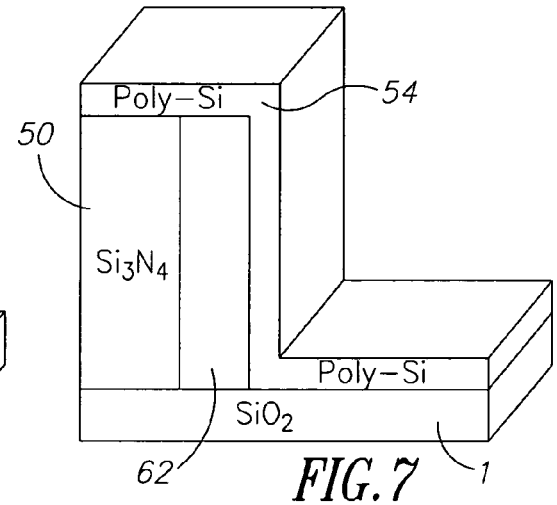
Figure 8:
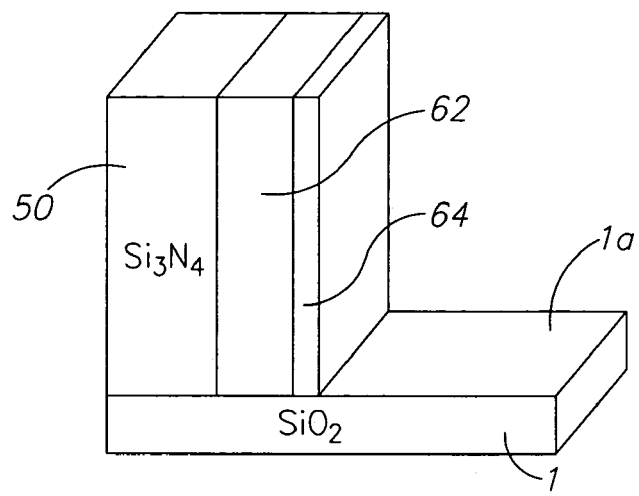
Figure 19:
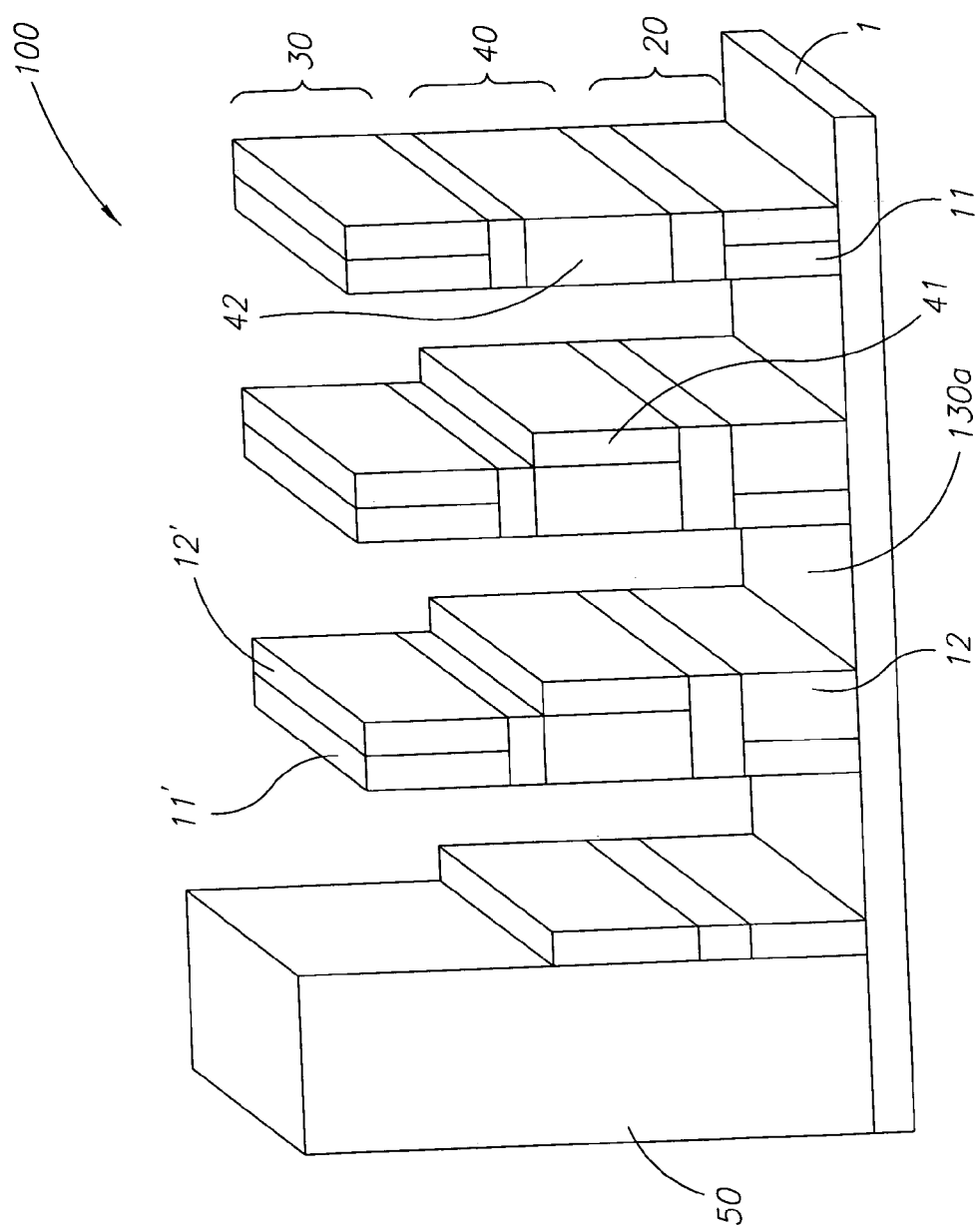
Figure 20:
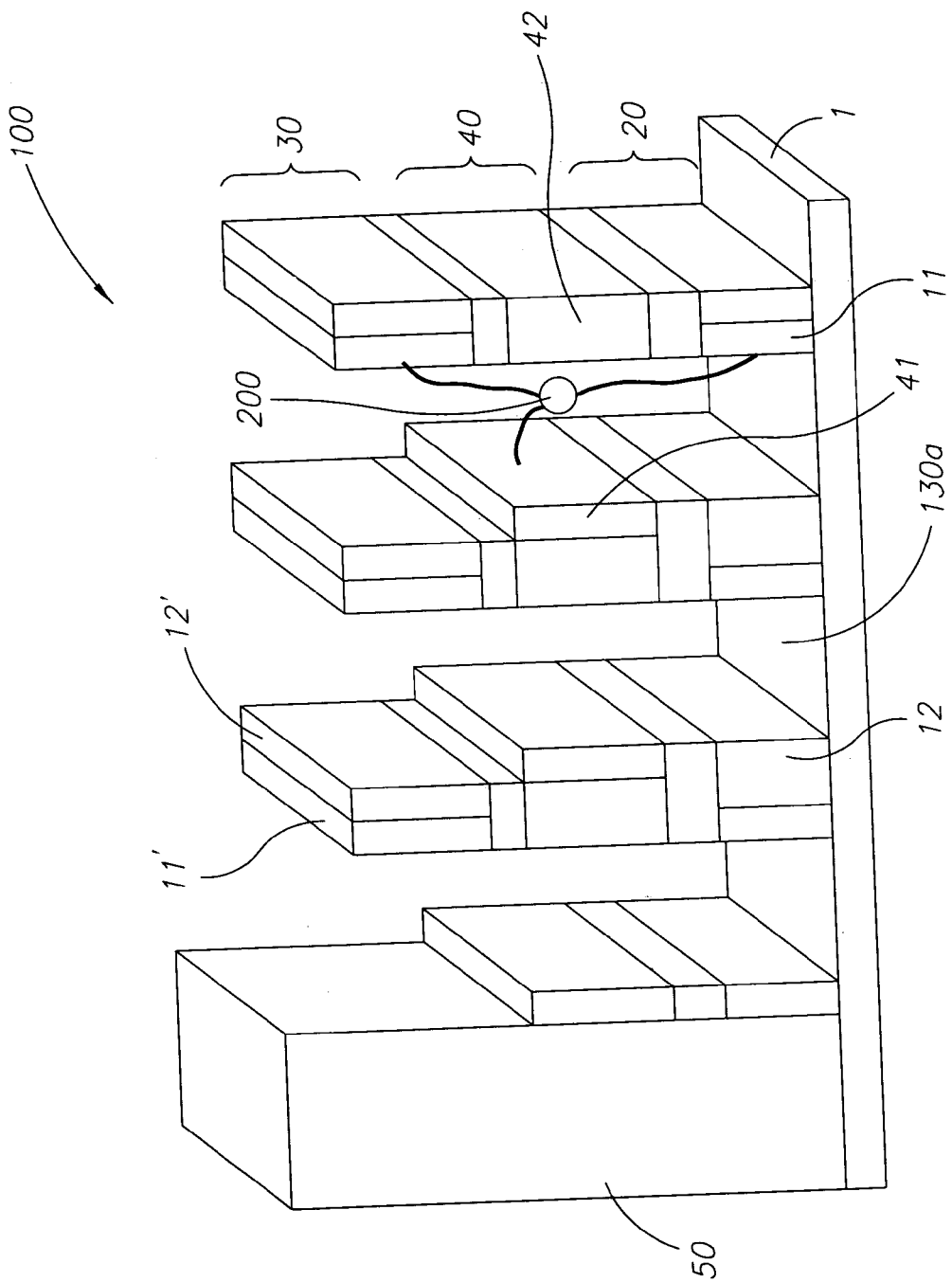
FIG. 20 shows an embodiment of a nanometric device comprising a molecular component within a hosting structure.

It is to be noted how it is possible and preferred, through the control of the thickness of the deposited layers, with subsequent control of the width of the spacers realized therefrom in each of the multilayer bodies, to realize, further to the last selective etching step, a hosting structure 100 as the one represented in FIG. 19, wherein in each transversal slot 130a three conductive spacers (11, 11', 41) are facing each other and being arranged in a staggered fashion, as previously described in relation to the FIG. 3. This hosting structure 100 is particularly advantageous since all the hosting seats 130a can be exploited for hosting, addressing and driving molecular components such as transistors, by orienting the three-functionalized molecules 200 which realize them, as shown in FIG. 20.

Obviously, the last selective etching step may comprise more different selective etching operations, in the case wherein the intermediate insulating layers, as well as the insulating spacers in the different multilayer bodies, are realized with different insulating materials.

It is naturally possible, with the method according to the invention, to realize nanometric hosting structures comprising more than three array levels, for hosting even more complex functionalized molecules.

In practice, hosting structures of this type can be realized by repeating the steps which lead to the realization of further re-dimensioned intermediate multilayer bodies, eventually separated by further intermediate insulating layers.

It is important, in the repetition of these steps, to control the thickness of the deposited layers so as to realize conductive spacers, i.e., conductive terminals, of each two consecutive array levels to lie on different and parallel planes.

Obviously, in the present description and in the following claims, deposition of a layer of insulating material, in particular if an insulating oxide is considered, stands for any step suitable for realizing such a layer; including both a step comprising an effective deposition of the insulating oxide for example by means of "CVD-oxide" technique (control vapor oxide), and a step comprising a growth of the oxide from an underlying layer, for example with a "thermal oxidation" technique.

Similarly, selective etching of a layer means any step suitable for removing such a layer, for example by means of anisotropic chemical etching, by means of ionic bombardment or through sputtering.

A main advantage of the method shown in FIGS. 4-20 is in the possibility of realizing a nanometric structure, in particular a structure comprising nanometric hosting seats suitable for hosting, addressing and driving nanometric molecular components realized by means of functionalized molecules.

In particular the method allows to realize a plurality of nanometric conduction terminals, arranged on a desired number of parallel and growing planes, which face in the above hosting seats for driving the above molecular components, by orienting the functionalized molecules which realize them.

A further advantage of the present method stays in the possibility of realizing a structure of the above considered type, wherein both the plurality of hosting seats and the conduction terminals can be realized with different dimensions.

This realization allows for hosting molecular components of different nature and dimensions, and of individually asking the single terminals.

A further advantage is in its easiness and speed of realization steps being provided which are easy to be integrated in the productive processes currently in use for realizing semiconductor devices.

In substance, thanks to the present invention it is possible to realize a nanometric semiconductor electronic device of a hybrid type, i.e., a semiconductor device whose molecular components realized by means of suitably functionalized molecules are hosted in the hosting seats of the structure, and here suitably addressed and driven by means of conduction terminals of the structure itself.

In particular, it is possible to predispose the hosting structure for hosting the molecular components as described in U.S. Pat. No. 6,724,009, in the name of STMicroelectronics, S.r.l., the assignee of the present application, which patent is incorporated herein by reference in its entirety. By using the method described in this application, the molecular components in the hosting seats of the structure automatically bond to the conductive spacers which realize the conduction terminals.

Advantageously, the realization of the hosting structure is completed prior to the hosting therein of the molecular components and to the subsequent realization of the desired hybrid semiconductor device. In this way, the molecular components do not undergo any stress linked to the process steps for realizing the hosting structure.

Obviously, a technician of the field will bring, with the aim of meeting contingent and specific needs, several changes to the above described invention all however are within the scope of protection of the invention, as defined by the hereafter reported claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A hosting structure of nanometric components comprising:
   a substrate having a top surface;
   a plurality of array levels on the top surface of said substrate, the array levels being arranged consecutively on each other and in parallel planes,
   each array level including a plurality of conductive spacers alternating with a plurality of insulating spacers, each conductive spacer and an adjoining insulating spacer forming a spacer pair, wherein the conductive spacer and the insulating spacer of each spacer pair contact one another along respective faces that are substantially perpendicular to the top surface of the substrate, and wherein, each two consecutive spacer pairs of the same array level define a gap therebetween, and wherein, conductive spacers of any two consecutive array levels are positioned on distinct and parallel planes, said gaps of different array levels being at least partially aligned along a direction substantially perpendicular to the top surface of said substrate with definition of a plurality of transversal hosting seats extended along said direction and suitable for hosting at least a nanometric component.

2. The structure according to claim 1, wherein the conductive spacers of overlapped array levels facing in a same hosting seat form opposite side walls of said hosting seat, said side walls being substantially perpendicular to the top surface of said substrate.

3. The structure according to claim 2, further comprising molecular components, wherein said conductive spacers form conduction terminals for the molecular components hosted in said plurality of hosting seats.

4. The structure according to claim 1, further comprising between each pair of consecutive array levels a discontinuous insulating layer.

5. The structure according to claim 1, wherein a single gap is defined between consecutive spacer pairs.

6. The structure according to claim 1, wherein an array level includes insulating spacers realized in at least two different insulating materials.

7. The structure according to claim 1, wherein the conductive spacers of a same array level have constant thickness.

8. The structure according to claim 1, wherein the conductive spacers of different array levels have equal thickness to each other.

9. The structure according to claim 1, wherein the gaps of different array levels have equal widths to each other.

10. The structure according to claim 1, wherein said hosting seats have a constant width.

11. A nanometric electronic device comprising a nanometric component and a hosting structure, the hosting structure having:
a substrate having a top surface;
a plurality of array levels on the top surface of said substrate, the array levels being arranged consecutively on each other and in parallel planes,
each array level including a plurality of conductive spacers alternating with a plurality of insulating spacers, each conductive spacer and an adjoining insulating spacer forming a spacer pair, wherein the conductive spacer and the insulating spacer of each spacer pair contact one another along respective faces that are substantially perpendicular to the top surface of the substrate, and wherein each two consecutive spacer pairs of the same array level define a gap therebetween, and wherein, conductive spacers of any two consecutive array levels are positioned on distinct and parallel planes, said gaps of different array levels being at least partially aligned along a direction substantially perpendicular to the top surface of said substrate with definition of a plurality of transversal hosting seats extended along said direction and suitable for hosting the nanometric component, said conductive spacers of said hosting structure defining respective conduction terminals of said at least one nanometric component.

12. An electronic device according to claim 11, wherein said at least one nanometric component comprises a molecular component realized by a functionalized molecule.

13. A structure for hosting nanometric components comprising:
a substrate having a top surface; and
a plurality of spacer stacks on top of the substrate, each spacer stack being substantially parallel to each other and extending substantially perpendicular to the top surface of the substrate, every two adjacent spacer stacks of the plurality defining a gap, each spacer stack comprising:
a first spacer pair having a first conductive spacer adjoining a first insulating spacer, wherein the first conductive spacer and the first insulating spacer of each first spacer pair contact one another along respective faces that are substantially perpendicular to the top surface of the substrate; and
a second spacer pair overlying the first spacer pair and having a second conductive spacer adjoining a second insulating spacer, wherein the second conductive spacer and the second insulating spacer of each second spacer pair contact one another along respective faces that are substantially perpendicular to the top surface of the substrate.

14. The structure according to claim 13 wherein the first conductive spacer and the second conductive spacer of each spacer stack are on opposite sides of the spacer stack.

15. The structure according to claim 13 wherein the first conductive spacer of a spacer stack and the second conductive spacer of an adjacent spacer stack face inward to the gap defined by the two adjacent spacer stacks.

16. The structure according to claim 13 wherein the first and second conductive spacers are formed of the same conductive material.

17. The structure according to claim 13 wherein the first and second conductive spacers are polysilicon.

18. The structure according to claim 13 wherein the first and second insulating spacers are formed of different insulating materials.

19. The structure according to claim 13 wherein the first and second insulating spacers are formed of silicon oxide and silicon nitride.

20. The structure according to claim 13 wherein each spacer stack further comprising an insulating layer interposed between the first spacer pair and the second spacer pair.

21. The structure according to claim 20 wherein the insulating layer is formed of the same insulating material as that of the first insulating spacer.

22. The structure according to claim 13 wherein the gap is less than 50 nm wide.

23. The structure according to claim 13 wherein each spacer stack further comprising a third spacer pair between the first and second spacer pairs, the third spacer pair having a third conductive spacer adjoining a third insulating spacer.

24. The structure according to claim 23 wherein the first, second and third conductive spacers of each spacer stack are arranged in a staggered manner in which conductive spacers of each two consecutively stacked spacer pairs are on opposite sides of the spacer stack.

25. The structure according to claim 24 wherein the third insulating spacer is of a different insulating material from that of the second insulating material.

26. The structure according to claim 23 wherein the gap is less than 50 nm.

27. A structure for hosting nanometric components comprising:
a substrate having a top surface; and
a plurality of spacer stacks on top of the substrate, each spacer stack being substantially parallel to each other and extending substantially perpendicular to the top surface of the substrate, every two adjacent spacer stacks defining a gap, each spacer stack comprising a plurality of spacer pairs stacked on top of one another, each spacer pair having a conductive spacer adjoining an insulating spacer, wherein the first conductive spacer and the first insulating spacer of each first spacer pair contact one another along respective faces that are substantially perpendicular to the top surface of the substrate, and wherein the conductive spacers of every two consecutively stacked spacer pairs are on opposite sides of the spacer stack.

28. The structure according to claim 27 wherein each spacer stack further comprising a plurality of insulating layer, each insulating layer being interposed between two consecutively stacked spacer pairs.

29. A nanometric electronic device comprising:
a hosting structure having:
  a substrate having a top surface;
  a plurality of spacer stacks on top of the substrate, each spacer stack being substantially parallel to each other and extending substantially perpendicular to the top surface of the substrate, every two adjacent spacer stacks defining a gap, each spacer stack comprising a first spacer pair having a first conductive spacer adjoining a first insulating spacer, wherein the first conductive spacer and the first insulating spacer of each first spacer pair contact one another along respective faces that are substantially perpendicular to the top surface of the substrate; and a second spacer pair overlying the first spacer pair and having a second conductive spacer adjoining a second insulating spacer, wherein the second conductive spacer and the second insulating spacer of each second spacer pair contact one another along respective faces that are substantially perpendicular to the top surface of the substrate, wherein the first conductive spacer of a spacer stack and the second conductive spacer of an adjacent spacer stack face inward to the gap defined by the two adjacent spacer stacks, thereby forming respective conductive terminals, and
a plurality of nanometric components, each nanometric component being oriented between respective conductive terminals within the gap.

30. The nanometric electronic device according to claim 29 wherein the nanometric component is a bi-functional molecules having two functional groups capable of bonding to respective conductive terminals.

31. A nanometric electronic device comprising:
a hosting structure having:
  a substrate having a top surface; and
  a plurality of spacer stacks on top of the substrate, each spacer stack being substantially parallel to each other and extending substantially perpendicular to the top surface of the substrate, every two adjacent spacer stacks defining a gap, each spacer stack comprising a plurality of spacer pairs stacked on top of one another, each spacer pair having a conductive spacer adjoining an insulating spacer, wherein the first conductive spacer and the first insulating spacer of each first spacer pair contact one another along respective faces that are substantially perpendicular to the top surface of the substrate, the conductive spacers of every two consecutively stacked spacer pairs are on opposite sides of the spacer stack;
a plurality of nanometric components, each nanometric component being oriented within the gap.

32. The nanometric electronic device according to claim 31 wherein each spacer stack comprises two spacer pairs and the nanometric component is a bi-functional molecule.

33. The nanometric electronic device according to claim 31 wherein each spacer stack comprises three spacer pairs and the nanometric component is a tri-functional molecule.

34. The hosting structure of claim 1 wherein each conductive spacer has a thickness of less than 50 nm in a direction transverse to the respective faces of the conductive spacer and the insulating spacer that contact one another.

35. The nanometric electronic device of claim 11 wherein each conductive spacer has a smallest dimension in a direction transverse to the respective faces of the conductive spacer and the insulating spacer that contact one another.

36. The structure of claim 13 wherein each conductive spacer has a thickness of less than 50 nm in a direction transverse to the respective faces of the conductive spacer and the insulating spacer that contact one another.

37. The nanometric electronic device of claim 29 wherein each conductive spacer has a thickness of less than 50 nm in a direction transverse to the respective faces of the conductive spacer and the insulating spacer that contact one another.

38. The nanometric electronic device of claim 31 wherein each conductive spacer has a smallest dimension in a direction transverse to the respective faces of the conductive spacer and the insulating spacer that contact one another.

* * * * *